US010129831B2

(12) United States Patent
Mason et al.

(10) Patent No.: US 10,129,831 B2
(45) Date of Patent: Nov. 13, 2018

(54) WIRELESS QUIET ENROLMENT

(71) Applicant: Microchip Technology Incorporated, Chandler, AZ (US)

(72) Inventors: Ralph Mason, Ottawa (CA); Andrew Burns, Ottawa (CA); Chengbin Fan, Ottawa (CA)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 538 days.

(21) Appl. No.: 14/669,460

(22) Filed: Mar. 26, 2015

(65) Prior Publication Data

US 2015/0312860 A1    Oct. 29, 2015

Related U.S. Application Data

(60) Provisional application No. 61/984,092, filed on Apr. 25, 2014.

(51) Int. Cl.
| | |
|---|---|
| *H03J 1/00* | (2006.01) |
| *H04W 52/02* | (2009.01) |
| *H04B 17/318* | (2015.01) |
| *H04L 12/751* | (2013.01) |
| *H04W 8/00* | (2009.01) |
| *H04W 76/14* | (2018.01) |

(52) U.S. Cl.
CPC ....... *H04W 52/0241* (2013.01); *H03J 1/0066* (2013.01); *H04B 17/318* (2015.01); *H04L 45/026* (2013.01); *H04W 8/005* (2013.01); *H04W 76/14* (2018.02); *Y02D 70/142* (2018.01); *Y02D 70/144* (2018.01)

(58) Field of Classification Search
CPC . H04W 76/046; H04W 40/005; H04W 52/04; H04L 27/2691; H04L 1/0044; H04B 1/715; H04B 17/318; H04N 1/00896; H01Q 1/1257; H03J 1/0066
See application file for complete search history.

(56) References Cited

U.S. PATENT DOCUMENTS

| | | | | |
|---|---|---|---|---|
| 2012/0250610 | A1* | 10/2012 | Budampati | H04L 67/125 370/328 |
| 2012/0300761 | A1* | 11/2012 | Vasko | H04W 48/16 370/338 |
| 2012/0320955 | A1* | 12/2012 | Ueda | H04W 52/0274 375/219 |

(Continued)

OTHER PUBLICATIONS

International Search Report and Written Opinion, Application No. PCT/US2015/026816, 13 pages, dated Jul. 15, 2015.

(Continued)

*Primary Examiner* — Salvador E Rivas
(74) *Attorney, Agent, or Firm* — Slayden Grubert Beard PLLC

(57) ABSTRACT

In a wireless media network a source device provides entertainment content to a sink device over a radio frequency (RF) wireless channel. The source device can go into a receive only quiet enrolment mode until activated by a sink device transmitting enrolment trigger packets or having a signal strength above a certain threshold, thereby improving coexistence with other wireless devices. The source device changes from the quiet enrolment mode to an active enrolment mode when activated by the sink device.

20 Claims, 7 Drawing Sheets

(56) References Cited

U.S. PATENT DOCUMENTS

| | | | |
|---|---|---|---|
| 2013/0067094 A1* | 3/2013 | Madhusudan | H04W 76/023 709/227 |
| 2013/0315121 A1* | 11/2013 | Sampathkumar | H04W 52/0216 370/311 |
| 2013/0329551 A1* | 12/2013 | Brisebois | H04W 4/001 370/230 |
| 2014/0185821 A1* | 7/2014 | Ushakov | H04R 1/1033 381/74 |

OTHER PUBLICATIONS

European Office Action, Application No. 15721921.3, 8 pages, dated Apr. 12, 2018.

* cited by examiner

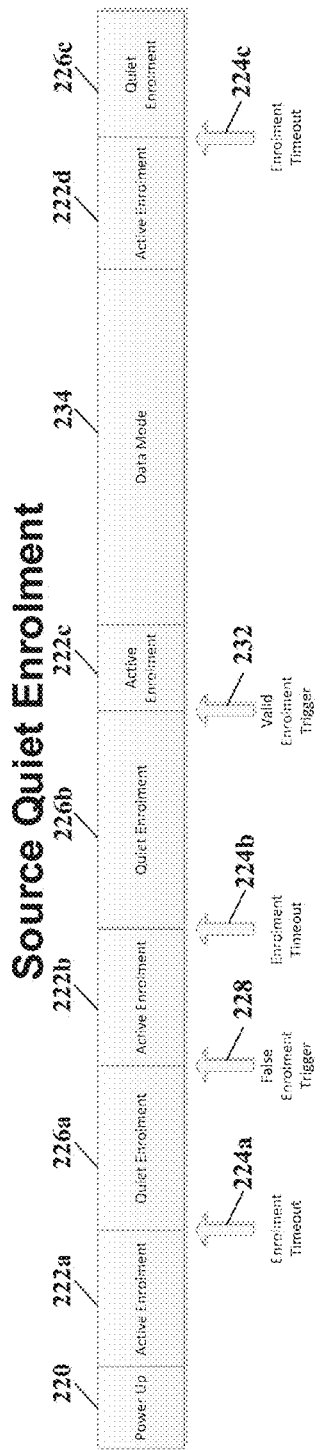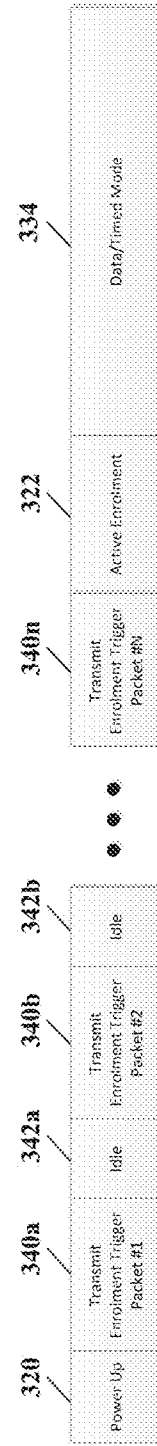
FIGURE 2
FIGURE 3

Enrolment Trigger Packets

| Offset | Size/Bits | Fields | Description |
|---|---|---|---|
| Common Header | | | |
| 0 | 1-byte | HDR_CTRL | Header Control |
| | Bit 7 | DIR | Set to 1 – SNK Packet |
| | Bits 6-0 | PKT_TYPE | Set to 7 – Enrolment Trigger Packet |
| 1 | 1-byte | PAYLOAD_OFFSET | Payload Offset |
| Variable Header | | | |
| 2 | 6-bytes | SNK_UID | |
| ... | | | |
| 7 | | | |
| Future Variable Header Extension | | | |
| | Variable | | Reserved for use by future versions |
| Enrolment Trigger Payload | | | |
| PAYLOAD_OFFSET | 1-byte | Enrolment Trigger Data (0) | Random Enrolment Trigger Data Byte 0 |
| ... | 1-byte | Enrolment Trigger Data (1-N) | Random Enrolment Trigger Data Bytes 1 to N where (N-1) is the Quiet Enrolment Trigger Packet Payload Size in bytes |
| Future Enrolment Payload Extension | | | |
| ... | Variable | | Reserved for use by future versions |

FIGURE 6

WIRELESS QUIET ENROLMENT

RELATED PATENT APPLICATION

This application claims priority to commonly owned U.S. Provisional Patent Application No. 61/984,092; filed Apr. 25, 2014; which is hereby incorporated by reference herein for all purposes.

TECHNICAL FIELD

The present disclosure relates to wireless technology, in particular, to a method and system for improving wireless coexistence of various devices, in particular, in automobile and home entertainment wireless networks.

BACKGROUND

Wireless devices such as Microchip Technology Incorporated Kleer® radio frequency (RF) technology enables high quality, low latency wireless distribution of digital content to headphones, speakers and other audio devices to enhance the consumer's listening experience. These wireless devices may be used in, for example but are not limited to, home entertainment and automotive applications. Coexistence of various wireless devices in wireless environments has only recently become a major consideration in automobiles and home entertainment environments.

The wireless devices have an enrolment/paging mode to initiate their connection to media systems in the home or vehicle that can result in high duty cycle transmissions that may interfere with other wireless devices. In devices that are always on (e.g., automobile head unit wireless media source) wireless device transmissions may last for long periods of time or be on continuously. These wireless devices generally use RF transmissions in or near the 2.4 GHz ISM band that are also used by Wi-Fi®, Bluetooth® and Kleer® transceivers. Even though multiple RF channels may be used, interference and wireless device operational degradation may occur when multiple wireless devices are being used simultaneously together. Kleer® is a registered trademark of Microchip Technology Incorporated, Wi-Fi® is a registered trademark of Wi-Fi Alliance, and Bluetooth® is a registered trademark of the Bluetooth SIG.

SUMMARY

Therefore a need exists for improved coexistence between wireless devices so that they may all operate correctly together.

According to an embodiment, a wireless media network, may comprise: a source device for wirelessly transmitting media data packets; and at least one sink device for wirelessly receiving the media data from the source device; the source device comprises an active enrolment mode, a quiet enrolment mode and a data mode, wherein the source device transmits enrolment packets and listens for response packets from the at least one sink device when in the active enrolment mode, if valid response packets for active enrolment are received from the at least one sink device then the source device goes into the data mode with the at least one sink device and transmits the media data packets thereto, and the source device listens for a signal from the at least one sink device when in the quiet enrolment mode, when the signal may be received then the source device goes into the active enrolment mode, and if the valid response packets for active enrolment may not be received from the at least one sink device then the source device goes back into the quiet enrolment mode after an enrolment timeout.

According to a further embodiment, the quiet enrolment mode may be disabled then the source device will go into a power down/sleep mode if the valid response packets for active enrolment may not be received after the enrolment timeout. According to a further embodiment, the signal from the at least one sink device may comprise at least one enrolment trigger packet. According to a further embodiment, the signal from the at least one sink device may comprise a peak RSSI having a level that may be greater than a quiet enrolment trigger threshold. According to a further embodiment, the signal from the at least one sink device may comprise an average RSSI over a time period having a level that may be greater than a quiet enrolment trigger threshold. According to a further embodiment, the sink device may transmit a plurality of enrolment trigger packets that may have idle times therebetween.

According to a further embodiment, the plurality of enrolment trigger packets may comprise a common header, a plurality of a variable header bytes and a variable sized enrolment trigger payload. According to a further embodiment, the common header may comprise a packet type and a payload offset. According to a further embodiment, the plurality of the variable header bytes may comprise a sink device unit identification. According to a further embodiment, the variable sized enrolment trigger payload may be determined by a quiet enrolment sink trigger packet payload size database setting. According to a further embodiment, the source device may leave the quiet enrolment mode when an external input may be detected. According to a further embodiment, the external input may be activation of an association button. According to a further embodiment, the external input may be activation of a remote control keys-in operation. According to a further embodiment, the external input may be reception of a sink quiet enrolment trigger packet.

According to another embodiment, a wireless device may be configured to connect and operate in a wireless network, wherein the wireless device may further be configured to operate in a first and a second operating mode, wherein the first mode may be an active mode that allows for transmission and reception of data and the second mode may be a quiet mode in which the wireless device may only receive data until a predefined token has been received.

According to a further embodiment, the token may be an enrolment trigger packet. According to a further embodiment, the enrolment trigger packet comprises a common header followed by a variable header followed by an enrolment trigger payload. According to a further embodiment, the enrolment trigger packet may be a valid Kleer® enrolment trigger packet. According to a further embodiment, the token may provide for detection of a peak or average RSSI level on an enrolment trigger channel that may be greater than a quiet enrolment trigger threshold. According to a further embodiment, the device may be further configured to switch into the first operating mode after reception of a false enrolment trigger packet and then back to the second operating mode after an enrolment timeout. According to a further embodiment, when in the second operating mode the wireless device may be configured as a receiver on the quiet enrolment trigger channel and may be waiting for the enrolment trigger packet to switch to the first operating mode.

According to yet another embodiment, a wireless protocol for a packet based transmission network may provide for a wireless device to switch between an active enrolment mode and a quiet enrolment mode, wherein the active enrolment mode may allow for transmission and reception of data and in the quiet enrolment mode the wireless device may only receive data until a predefined trigger packet may have been received.

According to a further embodiment, the trigger packet may comprise a common header followed by a variable header followed by an enrolment trigger payload. According to a further embodiment, the trigger packet may be a valid Kleer® enrolment trigger packet. According to a further embodiment, the trigger packet may provide for detection of a peak or average RSSI level on an enrolment trigger channel greater than a quiet enrolment trigger threshold. According to a further embodiment, the trigger packet may provide for filtering of false enrolment triggers by use of a unit identification field.

According to still another embodiment, a method for connecting source and sink devices together in wireless media network may comprise the steps of: transmitting media data from a source device, wherein the source device may comprise an active enrolment mode, a quiet enrolment mode and a data mode; receiving the media data from the source device with a sink device; transmitting active enrolment packets from the source device when in the active enrolment mode; listening with the source device for response packets from the sink device, wherein if valid response packets for active enrolment may be received from the sink device then the source device goes into the data mode with the sink device and may transmit the media data thereto; listening when the source device may be in the quiet enrolment mode for a certain signal from the sink device; filtering false enrolment trigger packets by using a unit identifier field; returning to the active enrolment mode when the certain signal may be received from the sink device; and returning to the quiet enrolment mode if the valid response packets for active enrolment may not be received from the sink device after an enrolment timeout.

According to a further embodiment of the method, the certain signal may comprise a valid signal having a correct unit identification field. According to a further embodiment of the method, the certain signal may comprise a sufficiently strong signal. According to a further embodiment of the method, when the quiet enrolment mode is disabled, may further comprise the step of putting the source device into a power down/sleep mode if the valid response packets for active enrolment may not be received after the enrolment timeout.

BRIEF DESCRIPTION OF THE DRAWINGS

A more complete understanding of the present disclosure may be acquired by referring to the following description taken in conjunction with the accompanying drawings wherein:

FIG. 2 illustrates a schematic diagram of a source quiet enrolment sequence, according to a specific example embodiment of this disclosure;

FIG. 3 illustrates a schematic diagram of a sink quiet enrolment sequence, according to a specific example embodiment of this disclosure;

FIG. 6 illustrates a table of enrolment trigger packet structure on the enrolment trigger channel, according to a specific example embodiment of this disclosure;

Figure 1:
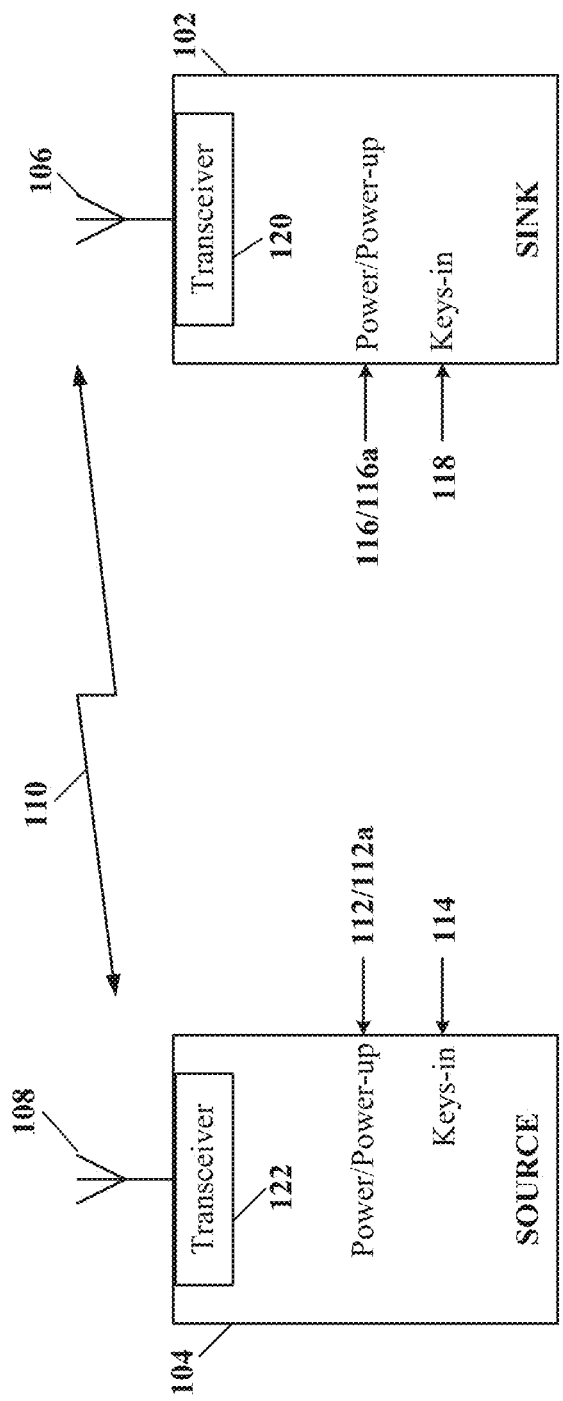
FIG. 1 illustrates a schematic block diagram of wireless source and sink devices, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure a complete hardware and software solution may be provided that enables wireless audio in home and portable consumer electronics (CE) products and features interoperability across various products and brands. Wireless compatible products allow users to recognize and pair with other wireless products to access and stream, for example but not limited to, multiple music sources, speakers or headphones, creating a versatile and comprehensive platform.

According to various embodiments, a quiet enrolment mode feature for a wireless device is introduced which allows a source device to stay in receive mode until activated by a sink device thereby improving coexistence with other wireless devices.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of wireless source and sink devices, according to the teachings of this disclosure. A source device 104 will generally provide entertainment content wirelessly to a sink device 102 over a radio frequency (RF) wireless channel 110. The source device 104 incorporates a RF transceiver 122 coupled to an antenna 108. The sink device 102 incorporates a RF transceiver 120 coupled to an antenna 106. Entertainment content transfer may be initiated by applying power 112 or 116 to the source device 104 or the sink device 102, respectively. A "keys-in" signal 114 or 118 (e.g., push button on device) may also be used to initiate entertainment content transfer between the source device 104 and the sink device 102.

Referring to FIG. 2, depicted is a schematic diagram of a source quiet enrolment sequence, according to a specific example embodiment of this disclosure. FIG. 2 shows an example of a quiet enrolment operation on a source device 104. When the source device 104 is first powered up 220 (either by power applied to the power pin 112 or activation of the PU pin 112a) it goes into an active enrolment mode 222a similar to the enrolment operation of conventional firmware loads. If active enrolment is not successful within the enrolment timeout period 224a, the source device 104 goes into quiet enrolment mode 226a instead of going to sleep or powering down as in legacy firmware loads.

In quiet enrolment mode 226a the source device 104 is configured as a receiver and waits for an enrolment trigger packet from a sink device 102 to switch it back to active enrolment mode 222. If it gets a false enrolment trigger packet 228 then it will switch to active enrolment mode 222b and then back to quiet enrolment mode 226b after the enrolment timeout 224b as shown in FIG. 2. It is contemplated and within the scope of this disclosure that the UID (Unit IDentification) may also be used to filter out false triggers. If the source is in quiet enrolment mode 226b and it gets a valid enrolment trigger 232 it will switch to active enrolment mode 222c and try to enroll the triggering device 102. If the enrolment is successful the source device 104 and the sink device 102 will go into data mode 234, otherwise, the enrolment will timeout 224c again and the source device 104 will go back into quiet enrolment mode 226c. If the data mode 234 is terminated for any reason (e.g., sink device(s) 102 are powered down) the source device 104 will go into active enrolment 222d and then to quiet enrolment 226c at the end of the enrolment timeout 224c period if no new data session is established.

In quiet enrolment mode 226 the source device 104 is configured as a receiver on the quiet enrolment trigger channel and waits for an enrolment trigger packet to switch to active enrolment mode 222. The enrolment trigger packet may be a valid enrolment trigger packet that allows the UID to be evaluated or simply detection of a peak or average RSSI (Receive Signal Strength Indication) level on the enrolment trigger channel greater than quiet enrolment trigger threshold from the source device 104 RF transceiver 122. If an association button 114 or 118 is pressed or an association is initiated with a Kleer® ACSI (Audio Control and Status Interface Protocol) command while in quiet enrolment mode 226 the source device 104 will go into association mode but will return to active enrolment mode 222 when the association is completed or times out.

During initialization, a Quiet Mode disable database element may be read from external EEPROM (not shown) and stored in a memory map location in data memory (not shown). To enter quiet enrolment mode 226 the Quiet Mode Disable data memory may be set to 0. While in quiet enrolment mode the Quiet Mode disable memory location may be polled every 25 milliseconds to check its status. If the value is set, for example, to 1 for any reason then the source device 104 will exit Quiet Enrolment Mode and return to Active Enrolment Mode 222.

Packet Enrolment Trigger

When the source device 104 is configured to detect an enrolment trigger packet from a sink 102 the source device 104 is put into receive mode on the enrolment trigger channel and the packet timeout is disabled (e.g., it will stay in receive mode indefinitely). When a packet is detected it is checked to see if it is a valid enrolment trigger packet with a valid UID (Unit Identification). If the packet is a valid enrolment trigger packet then the source device 104 goes into active enrolment mode 222. If the packet is a false enrolment trigger packet the source device 104 goes back into receive mode with the packet timeout disabled and waits for a valid enrolment trigger packet. Note: if the source device 104 is forced to exit quiet enrolment mode 226 for some other reason (e.g., the association button 114 is pushed) then the firmware needs to make sure that the packet timeout enable is correctly configured.

An example enrolment trigger packet structure table is shown in FIG. 6. The packet structure may consist of two bytes of common header (containing the packet type and payload offset), 6 bytes of variable header (containing the sink UID) and a variable sized enrolment trigger payload. The payload size may be determined by the Quiet Enrolment Sink Trigger Packet Payload Size database element and may contain random data.

Peak RSSI Enrolment Trigger

The source device 104 can be configured to use either a peak or average RSSI value as an enrolment trigger. When configured for peak RSSI value the source device 104 is put in receive mode on the enrolment trigger channel and the packet timeout is disabled (e.g., it will stay in receive mode indefinitely). The source device 104 may then, for example but is not limited to, read the peak RSSI value every 88 μs and if the peak RSSI level is greater than the Quiet Enrolment Trigger Threshold the source may go into active enrolment mode 222. Note: if the source device 104 is forced to exit quiet enrolment mode 226 for some other reason (e.g., the association button 114 is pushed) then the firmware needs to make sure the packet timeout enable is correctly configured.

Average RSSI Enrolment Trigger

When the source device 104 is configured for an average RSSI trigger value the source device 104 may be put in receive mode on the enrolment trigger channel and the RSSI timeout may be set, for example but is not limited to, 88 μs times the value of the Quiet Enrolment Source RSSI timeout database element (e.g., if Quiet Enrolment Source RSSI database element is set to 0×02 then the source will use a time period of 2*88 μs~176 μs to generate the average RSSI value). The source device 104 receiver preferably may be configured so that the receive (RX) baseband may be disabled after the average RSSI value is calculated and then enabled again, preferably, as fast as possible with the same RSSI timeout to do another average RSSI reading. This process may repeat until an average RSSI value greater than the Quiet Enrolment Trigger Threshold is measured or the source device 104 is forced to exit quiet enrolment mode 226 for some other reason (e.g., associate button 114 is pushed). The source device 104 may read the average RSSI at the end of every RSSI timeout and if the average RSSI level is greater than the Quiet Enrolment Trigger Threshold the source device 104 may go into active enrolment mode 222.

False Enrolment Trigger

When using a packet enrolment trigger, any false packet detections are ignored as they will not have a correct sink device 102 UID. As a result, the source device 104 will go into active enrolment mode 222 only when a valid packet enrolment trigger has been received.

When using peak or average RSSI enrolment triggers it is possible to read RSSI levels above the Quiet Enrolment Trigger Threshold that are due to interference or from other sink devices 102 that have not been associated with the source device 104. In these cases the source device 104 will have a false enrolment trigger 228 and then go into active enrolment mode 222 even though a valid sink device 102 is not transmitting.

The probability of false enrolment triggers 228 can be reduced by using an average RSSI enrolment trigger with a long measurement time. There is however a penalty in that long measurement times increase the time to complete enrolment and also increases the amount of interference on the enrolment channel.

Referring to FIG. 3, depicted is a schematic diagram of a sink quiet enrolment sequence, according to a specific example embodiment of this disclosure. FIG. 3 shows an example of a quiet enrolment operation on a sink device 102. After the sink device 102 is powered up (either by power applied to the power pins 116 or activation of the PU pin 116a), if Quiet Mode Disable is for example set to 0, it immediately goes into quiet enrolment mode and transmits a sequence of enrolment trigger packets 340 on the enrolment trigger channel as described in the table shown in FIG. 6. The number of enrolment trigger packets 340 transmitted and the idle time 342 spacing between these packets 340 may be controlled by a Quiet Enrolment Sink Trigger Repeat and Quiet Enrolment Sink Trigger Spacing database elements. The payload size of the packets 340 may be controlled by the Quiet Enrolment Sink Trigger Packet Payload Size database element. After completing the transmissions the sink device 102 goes into active enrolment mode 322 similar to the enrolment operation of previous firmware loads. If Quiet Mode Disable is set for example to 1 after the sink device 102 is powered up it may go directly to active enrolment mode 322 without transmitting any enrolment trigger packets 340.

Figure 4:
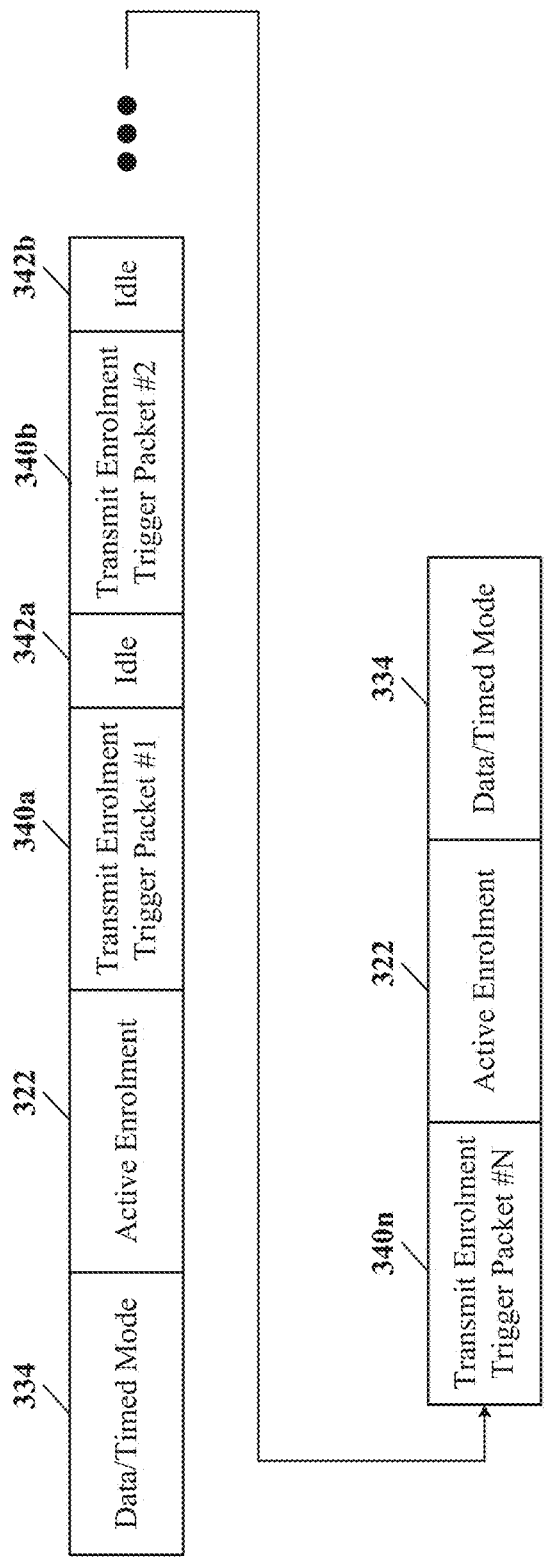
FIG. 4 illustrates a schematic diagram of remote control keys-in operation in active enrolment, according to a specific example embodiment of this disclosure.

For a sink remote control, if the enrolment is successful it will go into data/timed mode 334 and track the source device 104 that is in active enrolment mode 222. If a key press is pending, it will be delivered in timed mode. The remote device 102 will continue to track the source device 104 until the remote device 102 control powers down and goes to sleep or the source device 104 reaches the end of its enrolment timeout period 224 and goes into quiet enrolment mode 226. If the source device 104 goes into quiet enrolment mode 226 before the sink device 102 control powers down (see FIG. 4) then the sink device 102 control may go into active enrolment 322 in an untimed mode. If the sink device 102 control is in active enrolment mode 322 and receives a keys-in command from a button press 118 it will send a sequence of enrolment trigger packets identical to those sent at power up 116 and then return to active enrolment mode 322. If the sink device 102 has Sink Repeat Trigger Packets database element set for example to 1 then instead of going to sleep/power down at the end of enrolment timeout it will resend trigger packets and go back into active enrolment mode 322, and this loop will continue until the sink device 102 is either powered down or it goes into timed data or association mode.

It should be noted that the sink devices 102 may send the same enrolment trigger packets 340 for all signal detection methods (e.g., packet detection, RSSI peak detection or RSSI average detection) used on the source device 104.

For a sink headphone 102, if the enrolment is successful the sink device 102 will go into data mode 334. If the enrolment is not successful then the sink headphone 102 will power down or go to sleep at the end of the enrolment timeout period. If the sink headphone 102 has Sink Repeat Trigger Packets database element set for example to 1 then instead of going to sleep/power down it will resend trigger packets 340 and go back into active enrolment mode 322, and this loop will continue until the sink device 102 is either powered down or it goes into a data or association mode.

Figure 5:
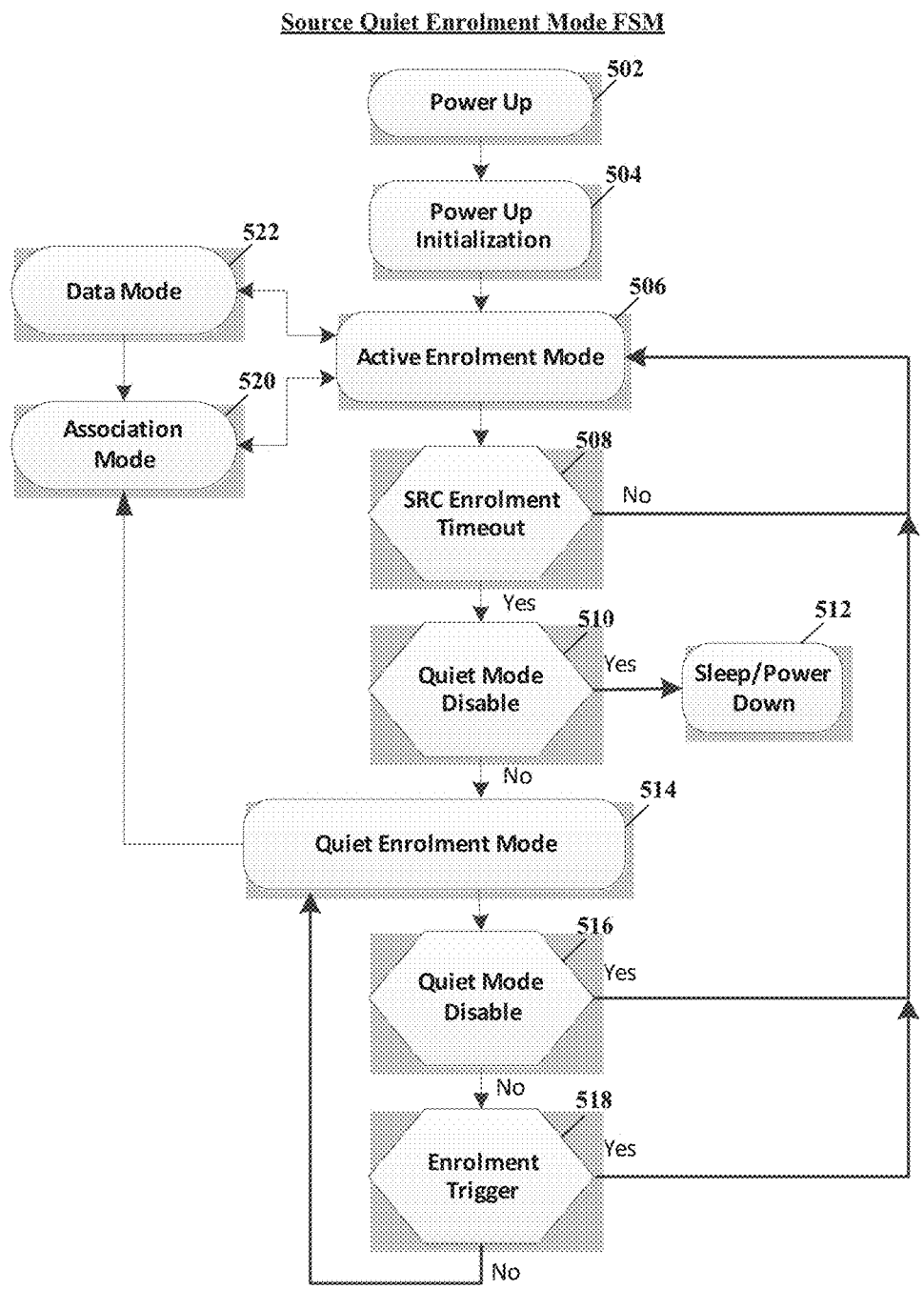
FIG. 5 illustrates a schematic flow diagram of a source quiet enrolment mode finite state machine (FSM), according to a specific example embodiment of this disclosure.

Referring to FIG. 5, depicted is a schematic flow diagram of a source quiet enrolment mode finite state machine (FSM), according to a specific example embodiment of this disclosure. In step 502 the source device 104 powers up. In step 504 a power up initialization is performed. In step 506 the source device 104 goes into active enrolment mode. In step 508 a SouRCe (SRC) enrolment is checked for timeout. If the SRC enrolment is performed before a SRC enrolment timeout occurs then the source device 104 returns to step 506 and remains in active enrolment mode 222. However, if in step 508 the SRC enrolment times out then in step 510 a check is made whether the quiet enrolment is disabled (checks Quiet Mode disable memory location). If the quiet enrolment has been disabled then in step 512 the source device 104 will go into a sleep/power down mode. However if the quiet enrolment has not been disabled then in step 510 the source device 104 will go back into the quiet enrolment mode 226.

In step 514, while in the quiet enrolment mode the quiet mode disable database element (bit) is checked and if it is disabled then return to the active enrolment mode step 506. If not, then step 518 checks if an enrolment trigger has been received. If an enrolment trigger was received then return to step 506 and go into active enrolment mode. If an enrolment trigger was not received then stay in quiet enrolment mode.

Figure 7:
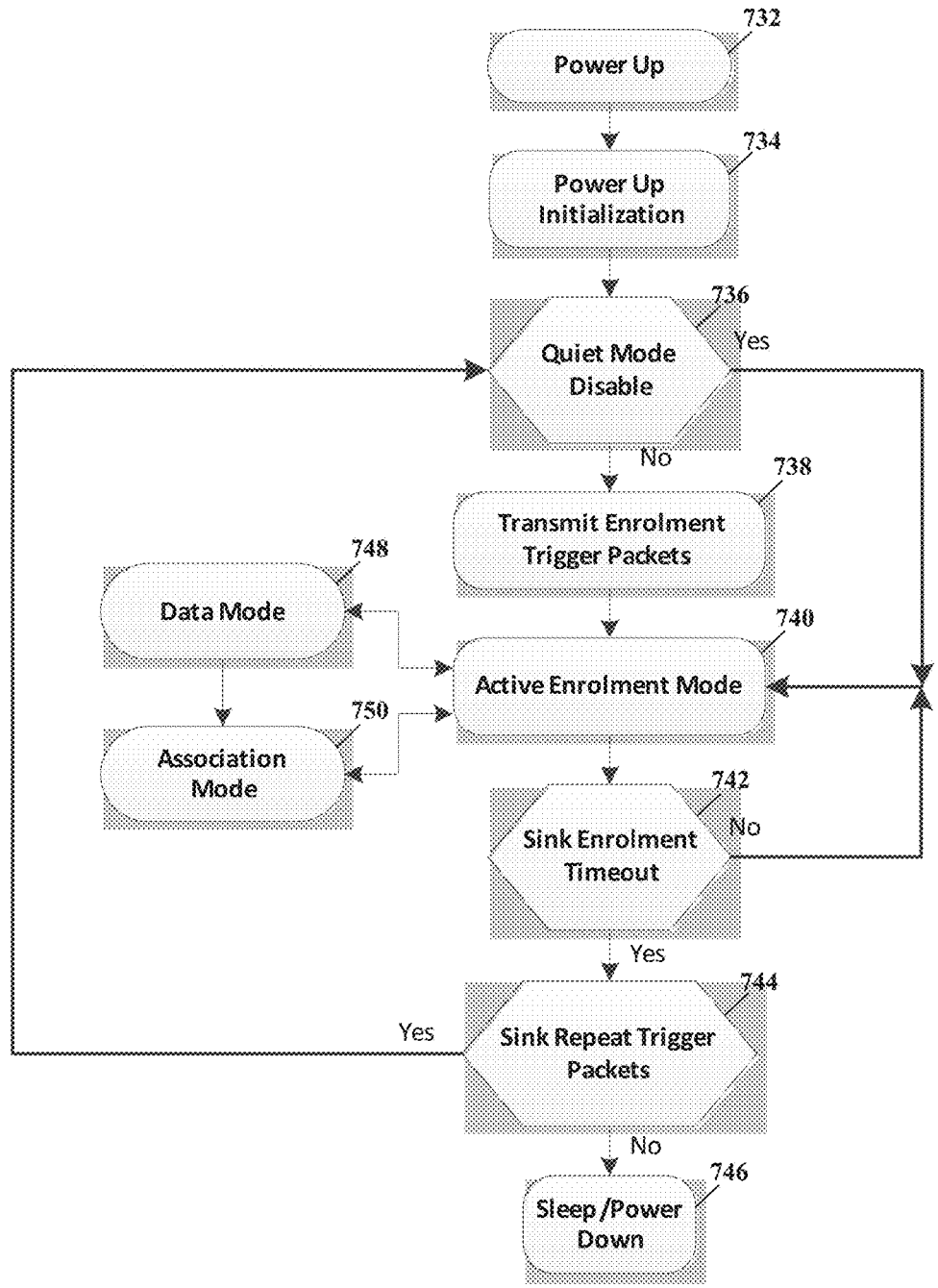
FIG. 7 illustrates a schematic flow diagram of a sink headphone quiet enrolment mode finite state machine (FSM), according to a specific example embodiment of this disclosure.

Referring to FIG. 7, depicted is a schematic flow diagram of a sink headphone quiet enrolment mode finite state machine (FSM), according to a specific example embodiment of this disclosure. In step 732 the sink headphone 102 powers up. In step 734 a power up initialization is performed for the sink headphone 102. In step 736 a check is made whether the quiet enrolment is disabled (checks Quiet Mode disable memory location). If the quiet enrolment was disabled then in step 740 the sink headphone 102 will go into active enrolment mode step 740. However if the quiet enrolment was not disabled then in step 738 the sink headphone 102 will transmit enrolment trigger packets. Then in step 740 the sink headphone 102 will go into the active enrolment mode step 740. Step 742 determines whether the sink enrolment has timed out. If the sink enrolment has not yet timed out then the sink 102 returns to step 740 where the sink headphone 102 remains in the active enrolment mode step 740. When step 742 determines that the sink enrolment has timed out then step 744 determines whether the sink headphone 102 should send repeat trigger packets. If trigger packets should be repeated then step 744 returns back to step 736 and the quiet mode disable is checked again. If trigger packets need not be repeated then in step 746 the sink headphone 102 goes into a sleep/power down mode.

When in active enrolment mode step 740 the sink device 102 may enter a data mode in step 748 by completing the enrolment process or exit from data mode step 748 by losing the data link 110. In active enrolment mode step 740 the sink device 102 may enter association mode step 750 based on receiving ASCI commands, an association button press 118 or exit association mode after completing the association process.

Figure 8:
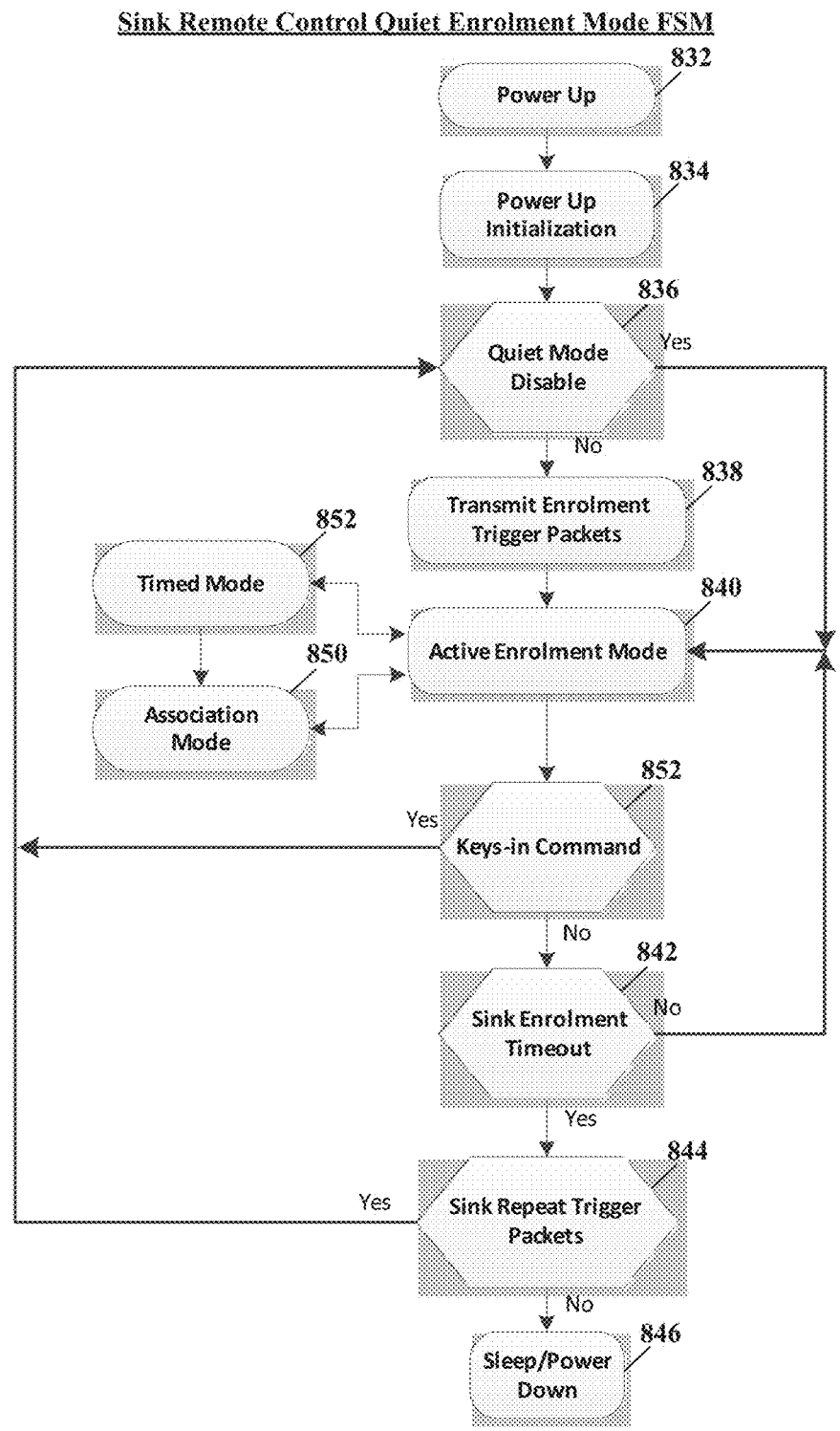
FIG. 8 illustrates a schematic flow diagram of a sink remote control quiet enrolment mode finite state machine (FSM), according to a specific example embodiment of this disclosure.

Referring to FIG. 8, depicted is a schematic flow diagram of a sink remote control quiet enrolment mode finite state machine (FSM), according to a specific example embodiment of this disclosure. In step 832 the sink remote 102 powers up. In step 834 a power up initialization is performed for the sink remote 102. In step 836 a check is made whether the quiet enrolment is disabled (checks Quiet Mode disable memory location). If the quiet enrolment has been disabled then in step 840 the sink remote 102 will go into an active enrolment mode step 840. However if the quiet enrolment has not been disabled then in step 838 the sink remote 102 will transmit enrolment trigger packets. Then in step 840 the sink remote 102 will go into the active enrolment mode step 840. Step 852 determines whether a keys-in command has been generated. If a keys-in command has been generated then sink remote returns to step 836 where a check is made again whether the quiet enrolment is disabled (checks Quiet Mode disable memory location). However if no keys-in command has been generated then step 842 determines whether the sink enrolment has timed out. If the sink enrolment has not timed out then it returns to step 840 where the sink remote 102 returns to active enrolment mode step 840. If the sink enrolment has timed out then step 844 determines whether the trigger packets should be repeated by the sink remote 102. If trigger packets should be repeated then step 844 returns back to step 836 and the quiet mode disable is checked again. If the trigger packets need not be repeated then in step 846 sink the remote 102 goes into a sleep/power down mode.

When in active enrolment mode step 840 the sink device 102 may enter a timed mode in step 852 by completing the enrolment process or exit from timed mode step 852 by losing the data link 110. In active enrolment mode step 840 the sink device 102 may enter association mode step 850 based on receiving ASCI commands, an association button press 118 or exit association mode after completing the association process.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A wireless media network, comprising:
   a source device for wirelessly transmitting media data packets; and
   at least one sink device for wirelessly receiving the media data from the source device;
   wherein the source device is configured to:
   operate in active enrolment mode, a quiet enrolment mode and a data mode;
   when in the active enrolment mode:
   transmit enrolment packets and listen for response packets from the at least one sink device;
   if valid response packets for active enrolment are received from the at least one sink device, go into the data mode with the at least one sink device and transmits the media data packets thereto;
   if the valid response packets for active enrolment are not received from the at least one sink device after an enrolment timeout:
   determine whether the quiet enrolment mode is disabled;
   if the quiet enrolment mode is disabled, go into a power down/sleep mode;
   if the quiet enrolment mode is enabled, enter the quiet enrolment mode;
   when in the quiet enrolment mode:
   listen for a signal from the at least one sink device, the signal comprising a peak RSSI having a level greater than a quiet enrolment trigger threshold;
   when the signal is received, go into the active enrolment mode.

2. The wireless media network according to claim 1, wherein the signal from the at least one sink device comprises at least one enrolment trigger packet.

3. The wireless media network according to claim 1, wherein the sink device transmits a plurality of enrolment trigger packets having idle times therebetween.

4. The wireless media network according to claim 3, wherein the plurality of enrolment trigger packets comprise a common header, a plurality of a variable header bytes and a variable sized enrolment trigger payload.

5. The wireless media network according to claim 4, wherein the common header comprises a packet type and a payload offset.

6. The wireless media network according to claim 4, wherein the plurality of the variable header bytes comprises a sink device unit identification.

7. The wireless media network according to claim 4, wherein the variable sized enrolment trigger payload is determined by a quiet enrolment sink trigger packet payload size database setting.

8. The wireless media network according to claim 1, further comprising the source device leaving the quiet enrolment mode when an external input is detected.

9. The wireless media network according to claim 8, wherein the external input is activation of an association button.

10. The wireless media network according to claim 8, wherein the external input is activation of a remote control keys-in operation.

11. The wireless media network according to claim 8, wherein the external input is reception of a sink quiet enrolment trigger packet.

12. A wireless device configured to connect and operate in a wireless network, wherein the wireless device is further configured to operate in a first, second, and third mode, wherein:
   the first mode is an active mode that allows for transmission and reception of data;
   the second mode is a quiet mode in which the wireless device can only receive data until a signal has been received; and
   the third operating mode is a power down/sleep mode;
   wherein in the active mode, the wireless device is configured to:
   transmit enrolment packets and listen for response packets from at least one sink device;
   if valid response packets for active enrolment are received from the at least one sink device, go into the data mode with the at least one sink device and transmits the media data packets thereto;
   if the valid response packets for active enrolment are not received from the at least one sink device after an enrolment timeout:
   determine whether the quiet mode is disabled;
   if the quiet mode is disabled, go into a power down/sleep mode;
   if the quiet mode is enabled, enter the quiet mode;
   wherein in the quiet mode, the wireless device is configured to:
   listen for the signal from the at least one sink device, the signal comprising a peak RSSI having a level greater than a quiet enrolment trigger threshold; and
   when the signal is received, go into the active enrolment mode.

13. The wireless device according to claim 12, wherein the signal is an enrolment trigger packet.

14. The wireless device according to claim 13, wherein the enrolment trigger packet comprises a common header followed by a variable header followed by an enrolment trigger payload.

15. The wireless device according to claim 13, wherein the enrolment trigger packet is a valid Kleer® enrolment trigger packet.

16. The wireless device according to claim 12, wherein the device is further configured to switch into the first operating mode after reception of a false enrolment trigger packet and then back to the second operating mode after an enrolment timeout.

17. The wireless device according to claim 12, wherein when in the second operating mode the wireless device is configured as a receiver on the quiet enrolment trigger channel and is waiting for the enrolment trigger packet to switch to the first operating mode.

18. A method for connecting source and sink devices together in wireless media network, comprising the steps of:
   transmitting media data from a source device, wherein the source device comprises an active enrolment mode, a quiet enrolment mode and a data mode;
   receiving the media data from the source device with a sink device;
   in the active encroment mode:
      transmitting active enrolment packets from the source device when in the active enrolment mode; and
      listening with the source device for response packets from the sink device; wherein if valid response packets for active enrolment are received from the sink device then the source device goes into the data mode with the sink device and transmits the media data thereto;
   in the quiet enrolment mode:
      listening for a certain signal from the sink device, the certain signal comprising a peak RSSI having a level greater than a quiet enrolment trigger threshold;
      filtering false enrolment trigger packets by using a unit identifier field;
      returning to the active enrolment mode when the certain signal is received from the sink device;
      if the valid response packets for active enrolment are not received from the sink device after an enrolment timeout:
         determining whether the quiet enrolment mode is disabled;
         if quiet enrolment mode is enabled, returning to the quiet enrolment mode; and
         if the quiet enrolment mode is disabled, putting the source device into a power down/sleep mode.

19. The method according to claim 18, wherein the certain signal comprises a valid signal having a correct unit identification field.

20. The method according to claim 18, wherein the certain signal comprises a sufficiently strong signal.

* * * * *

UNITED STATES PATENT AND TRADEMARK OFFICE
CERTIFICATE OF CORRECTION

| | | |
|---|---|---|
| PATENT NO. | : 10,129,831 B2 | Page 1 of 1 |
| APPLICATION NO. | : 14/669460 | |
| DATED | : November 13, 2018 | |
| INVENTOR(S) | : Ralph Mason et al. | |

It is certified that error appears in the above-identified patent and that said Letters Patent is hereby corrected as shown below:

In the Claims

Column 11,
Line 17, "in the active encroment mode:" should read -- in the active enrolment mode: --

Signed and Sealed this
Nineteenth Day of February, 2019

Andrei Iancu
*Director of the United States Patent and Trademark Office*